(12) United States Patent
Oka et al.

(10) Patent No.: US 6,258,927 B1
(45) Date of Patent: Jul. 10, 2001

(54) POLYAMIDE COMPOSITION

(75) Inventors: Hideaki Oka; Toru Kuki, both of Tsukuba; Kozo Tamura, Kurashiki, all of (JP)

(73) Assignee: Kuraray Co., Ltd., Kurashiki (JP)

( * ) Notice: Subject to any disclaimer, the term of this patent is extended or adjusted under 35 U.S.C. 154(b) by 0 days.

(21) Appl. No.: 09/494,046

(22) Filed: Jan. 31, 2000

(30) Foreign Application Priority Data

Jan. 29, 1999 (JP) .................................................. 11-021413

(51) Int. Cl.[7] .............................. C08L 77/00; C08L 77/06; C08K 5/00
(52) U.S. Cl. ..................... 528/310; 528/170; 528/322; 524/401; 524/405; 524/412; 524/432; 524/469; 524/600; 524/606
(58) Field of Search .................................... 528/310, 322, 528/170; 524/401, 405, 412, 432, 469, 600, 606

(56) References Cited

U.S. PATENT DOCUMENTS 5,338,791 * 8/1994 Chaplin ................................ 524/401
5,670,608 9/1997 Oka et al. ............................. 528/322

FOREIGN PATENT DOCUMENTS

| 0 960 907 | 12/1999 | (EP) . |
| WO 92/02578 | 2/1992 | (WO) . |
| WO 99/40157 | 8/1999 | (WO) . |

* cited by examiner

Primary Examiner—P. Hampton-Hightower
(74) Attorney, Agent, or Firm—Oblon, Spivak, McClelland, Maier & Neustadt, P.C.

(57) ABSTRACT

A polyamide composition, comprising:
(A) 100 parts by weight of a polyamide,
(B) from 10 to 200 parts by weight of an aromatic ring-containing bromine compound, and
(C) from 0.1 to 100 parts by weight of at least one flame-retardant synergist selected from metal salts of stannic acid and alkaline earth metal salts of boric acid. The polyamide composition has good flame retardancy and heat resistance, and exhibits good thermal stability and continuous moldability when molded in melt, and it can be molded into good moldings having excellent appearances, especially fine color tone, without giving much gas.

8 Claims, No Drawings

POLYAMIDE COMPOSITION

BACKGROUND OF THE INVENTION

1. Field of the Invention

The present invention relates to a polyamide composition and moldings therefrom. The polyamide composition of the invention has good flame retardancy and heat resistance, and exhibits good thermal stability and continuous moldability when molded in melt, and it can be molded into good moldings having excellent appearances, especially fine color tone, without giving much gas. Therefore, the polyamide composition is favorable to applications that require flame retardation, for example, to components of electric and electronic appliances such as connectors, switches, relays, printed-wiring boards, etc.; reflecting mirrors such as lamp reflectors, etc.; various components of machines; various components of decorations; films, sheets, fibers, etc.

2. Description of the Background

As having excellent properties and good melt-moldability, polyamides such as nylon 6, nylon 66, nylon 46, semiaromatic polyamides and others are heretofore much used for components of electric and electronic appliances. However, those polyamides are easily combustible resins. Therefore, in the field that requires flame retardation, for example, for components of electric and electronic appliances and others, used are polyamide compositions containing a flame retardant and a flame-retardant synergist. As the flame retardant for that purpose, generally used are brominated polymers; and as the flame-retardation synergist, used are antimony oxide compounds.

For example, in Japanese Patent Laid-Open No. 260951/1988 (U.S. Pat. No. 5,115,010), it is written that a polyamide composition as prepared by adding a halogenopolystyrene and/or a polycondensate of a halogenophenol, and sodium antimonate to a semiaromatic polyamide has good flame retardancy, good heat resistance and good mechanical properties. In Japanese Patent Laid-Open No. 320503/1993, it is written that a polyamide composition as prepared by adding a polybromostyrene and sodium antimonate to a crystalline polyamide resin having a melting point of not lower than 270° C. has good heat resistance and gives good moldings having excellent surface appearances.

However, the present inventors have found that the polyamide compositions comprising a brominated polymer and sodium antimonate such as those described in the patent publications noted above could not exhibit good thermal stability and give much gas when they are molded in melt, and that their moldings have poor appearances in that they are unfavorably colored.

SUMMARY OF THE INVENTION

The object of the present invention is to provide a polyamide composition having good flame retardancy and heat resistance, exhibiting good thermal stability and continuous moldability when molded in melt, and capable of being molded into good moldings having excellent appearances, especially fine color tone, without giving much gas (this means that the mold used for melt-molding the composition is hardly corroded), and It is another object of the invention to provide moldings of the polyamide composition.

The inventors have worked to solve the problems noted above and to attain the objects as above, and, as a result, have found that, when an aromatic ring-containing bromine compound serving as a flame retardant and a specific, antimony-free compound serving as a flame-retardant synergist are added to a polyamide, then the resulting polyamide composition has good flame retardancy and heat resistance, and exhibits good thermal stability and continuous moldability when molded in melt, and it can be molded into good moldings having excellent appearances, especially fine color tone, without giving much gas.

Accordingly, the invention provides a polyamide composition comprising:
(A) 100 parts by weight of a polyamide,
(B) from 10 to 200 parts by weight of an aromatic ring-containing bromine compound, and
(C) from 0.1 to 100 parts by weight of at least one flame-retardant synergist selected from metal salts of stannic acid and alkaline earth metal salts of boric acid.

The present invention also relates to moldings of the polyamide composition, and to methods of making the moldings.

The present invention also relates to methods of making the inventive polyamide composition.

A more complete appreciation of the invention and many of the attendant advantages thereof will be readily obtained as the same becomes better understood by reference to the following detailed description

DETAILED DESCRIPTION OF THE INVENTION

The polyamide (A) for use in the invention is not specifically limited and may be polyamide one generally usable in ordinary molding materials. It includes, for example, aliphatic polyamides such as nylon 6, nylon 11, nylon 12, nylon 66, nylon 610, nylon 612, nylon 69, nylon 1212, nylon 46 and their copolymers, etc.; as well as semiaromatic polyamides comprising dicarboxylic acid units of essentially aromatic dicarboxylic acid units and diamine units of essentially aliphatic alkylenediamine units, such as nylon 6T, nylon 9T, etc. Of those, preferred are semiaromatic polyamides as having good heat resistance and good water-absorption resistance.

As the aromatic dicarboxylic acid units constituting the semiaromatic polyamides, preferred are terephthalic acid units. Also preferably, the dicarboxylic acid units of the semiaromatic polyamides contain terephthalic acid units in an amount of from 60 to 100 mol %, more preferably from 70 to 100 mol %, even more preferably from 90 to 100 mol %. These ranges include all specific values and subranges therebetween, such as 65, 75, 80, 90, 95, 98 and 99 mol %. The preferred semiaromatic polyamides having a terephthalic acid unit content of at least 60 mol % give preferred moldings having better heat resistance and better water-absorption resistance.

Other dicarboxylic acid units than terephthalic acid units that may constitute the semiaromatic polyamides include, for example, units derived from aliphatic dicarboxylic acids such as malonic acid, dimethylmalonic acid, succinic acid, glutaric acid, adipic acid, 2-methyladipic acid, trimethyladipic acid, pimelic acid, 2,2-dimethylglutaric acid, 3,3- diethylsuccinic acid, azelaic acid, sebacic acid, suberic acid, etc.; alicyclic dicarboxylic acids such as 1,3-cyclopentanedicarboxylic acid, 1,4-cyclohexanedicarboxylic acid, etc.; and aromatic dicarboxylic acids such as isophthalic acid, 2,6-naphthalenedicarboxylic acid, 2,7-naphthalenedicarboxylic acid, 1,4-naphthalenedicarboxylic acid, 1,4-phenylenedioxy-diacetic acid, 1,3-phenylenedioxy-diacetic acid, diphenic acid, 4,4'-oxydibenzoic acid, diphenylmethane-4,4'-dicarboxylic acid, diphenylsulfone-4,4'-dicarboxylic acid, 4,4'-biphenyldicarboxylic acid, etc. The semiaromatic polyamides may contain one or more types of those additional units. Of the additional units, preferred are those derived from aromatic dicarboxylic acids. The additional dicarboxylic acid unit content of the semiaromatic polyamides is preferably at most 40 mol %, more preferably at most 30 mol %, even more preferably at most 10 mol %. These ranges include all specific values and subranges therebetween, such as at most 35, 25, 20 and 15 mol %. If desired, the semiaromatic polyamides may further contain units derived from polycarboxylic acids such as trimellitic acid, trimesic acid, pyromellitic acid and the like within a limited range within which the polyamide composition is moldable in melt.

As the aliphatic diamine units that constitute the semiaromatic polyamides, preferred are $C_{6-18}$ aliphatic alkylenediamine units. Also preferably, the diamine units of the semiaromatic polyamides contain $C_{6-18}$ aliphatic alkylenediamine units in an amount of from 60 to 100 mol %, more preferably from 75 to 100 mol %, even more preferably from 90 to 100 mol %. These ranges include all specific values and subranges therebetween, such as 65, 70, 80, 85, 95, 98 and 99 mol %. The preferred semiaromatic polyamides having a $C_{6-18}$ aliphatic alkylenediamine unit content of at least 60 mol % give preferred moldings having better heat resistance, better dimension stability and better surface smoothness. The $C_{6-18}$ aliphatic alkylenediamine units include, for example, units derived from linear aliphatic alkylenediamines such as 1,6-hexanediamine, 1,7-heptanediamine, 1,8-octanediamine, 1,9-nonanediamine, 1,10-decanediamine, 1,11-undecanediamine, 1,12-dodecanediamine, etc.; branched aliphatic alkylenediamines such as 1-butyl-1,2-ethanediamine, 1,1-dimethyl-1,4-butanediamine, 1-ethyl-1,4-butanediamine, 1,2-dimethyl-1,4-butanediamine, 1,3-dimethyl-1,4-butanediamine, 1,4-dimethyl-1,4-butanediamine, 2,3-dimethyl-1,4-butanediamine, 2-methyl-1,5-pentanediamine, 3-methyl-1,5-pentanediamine, 2,5-dimethyl-1,6-hexanediamine, 2,4-dimethyl-1,6-hexanediamine, 3,3-dimethyl-1,6-hexanediamine, 2,2-dimethyl-1,6-hexanediamine, 2,2,4-trimethyl-1,6-hexanediamine, 2,4,4-trimethyl-1,6-hexanediamine, 2,4-diethyl-1,6-hexanediamine, 2,2-dimethyl-1,7-heptanediamine, 2,3-dimethyl-1,7-heptanediamine, 2,4-dimethyl-1,7-heptanediamine, 2,5-dimethyl-1,7-heptanediamine, 2-methyl-1,8-octanediamine, 3-methyl-1,8-octanediamine, 4-methyl-1,8-octanediamine, 1,3-dimethyl-1,8-octanediamine, 1,4-dimethyl-1,8-octanediamine, 2,4-dimethyl-1,8-octanediamine, 3,4-dimethyl-1,8-octanediamine, 4,5-dimethyl-1,8-octanediamine, 2,2-dimethyl-1,8-octanediamine, 3,3-dimethyl-1,8-octanediamine, 4,4-dimethyl-1,8-octanediamine, 5-methyl-1,9-nonanediamine, etc. One or more types of these units may be used in the present invention.

Of the aliphatic alkylenediamine units noted above, preferred are units derived from 1,6-hexanediamine, 1,8-octanediamine, 2-methyl-1,8-octanediamine, 1,9-nonanediamine, 1,10-decanediamine, 1,11-undecanediamine, and 1,12-dodecanediamine, as giving better moldings having better heat resistance, better dimension stability and better surface appearances; and more preferred are 1,9-nonanediamine units and/or 2-methyl-1,8-octanediamine units. Where 1,9-nonanediamine units and 2-methyl-1,8-octanediamine units are combined for use herein, it is desirable that the ratio by mol of 1,9-nonanediamine unit/2-methyl-1,8-octanediamine unit falls between 99/1 and 1/99, more preferably between 95/5 and 40/60, even more preferably between 90/10 and 60/40.

Other diamine units than $C_{6-18}$ aliphatic alkylenediamine units that may constitute the semiaromatic polyamides include, for example, units derived from aliphatic diamines such as ethylenediamine, propanediamine, 1,4-butanediamine, etc.; alicyclic diamines such as cyclohexanediamine, methylcyclohexanediamine, isophoronediamine, norbornanedimethylamine, tricyclodecanedimethylamine, etc.: aromatic diamines such as p-phenylenediamine, m-phenylenediamine, p-xylylenediamine, m-xylylenediamine, 4,4'-diaminodiphenylmethane, 4,4'-diaminodiphenyl sulfone, 4,4'-diaminodiphenyl ether, etc. One or more types of these units are usable herein. The additional diamine unit content of the semiaromatic polyamides is preferably at most 40 mol %, more preferably at most 25 mol %, even more preferably at most 10 mol %. These ranges include all specific values and subranges therebetween, such as at most 35, 30, 20 and 15 mol %.

Preferably, the limiting viscosity [η] of the polyamide (A) for use in the invention, as measured in concentrated sulfuric acid at 30° C., falls between 0.4 and 3.0 dl/g, more preferably between 0.6 and 2.0 dl/g, even more preferably between 0.8 and 1.9 dl/g. The preferred polyamide (A) of which the limiting viscosity falls within the defined range as above gives preferred moldings having better mechanical properties and better heat resistance.

Also preferably, at least 10% of the terminal groups in the molecular chains of the polyamide (A) for use in the invention are blocked with a terminal-blocking agent. More preferably, in the molecular chains of the polyamide (A), the ratio of the terminal groups blocked with a terminal-blocking agent (percentage of terminal-blocking) is at least 40%, even more preferably at least 70%. The polyamide composition in which the polyamide has a percentage of terminal blocking of at least 10% has better physical properties, for example, having better melt moldability and better hot water resistance.

The percentage of terminal-blocking in the polyamide (A) can be obtained by counting the number of the terminal carboxyl groups, the terminal amino groups and the terminal groups blocked with a terminal-blocking agent in the polyamide. Concretely, it is derived from the following formula (1). In view of the accuracy and the easiness in the measurement operation, it is desirable that the number of the terminal groups in the polyamide is obtained through $^1$H-NMR in which the data for the specific signals corresponding to the terminal groups are separately integrated.

Percentage of Terminal Blocking (%)=[(A−B)/A]×100 (1), wherein A indicates the total number of all terminal groups in the molecular chains of the polyamide (in general, this is equal to two times the number of the polyamide molecules), and B indicates the total number of both the terminal carboxyl groups and the terminal amino groups in the molecular chains of the polyamide.

The terminal-blocking agent for use herein is not specifically defined, and may be any and every monofunctional compound having reactivity with the terminal amino or carboxyl groups in polyamides. Preferred for it are monocarboxylic acids and monoamines, since their reactivity is high and since the terminals of polyamides are stably blocked with them. More preferred are monocarboxylic acids, as they are easy to handle. In addition, also usable are acid anhydrides such as phthalic anhydride, etc., as well as monoisocyanates, mono-acid halides, monoesters, monoalcohols, etc.

The monocarboxylic acids herein usable as the terminal-blocking agent are not specifically defined, provided that they are reactive with amino groups. For example, they include aliphatic monocarboxylic acids such as acetic acid, propionic acid, butyric acid, valeric acid, caproic acid, caprylic acid, lauric acid, tridecanoic acid, myristic acid, palmitic acid, stearic acid, pivalic acid, isobutyric acid, etc.; alicyclic monocarboxylic acids such as cyclohexanecarboxylic acid, etc.; aromatic monocarboxylic acids such as benzoic acid, toluic acid, α-naphthalenecarboxylic acid, β-naphthalenecarboxylic acid, methylnaphthalenecarboxylic acid, phenylacetic acid, etc.; and mixtures of any of them. Of those, preferred are acetic acid, propionic acid, butyric acid, valeric acid, caproic acid, caprylic acid, lauric acid, tridecanoic acid, myristic acid, palmitic acid, stearic acid and benzoic acid, in view of their reactivity and costs and of the stability of the blocked terminals.

The monoamines herein usable as the terminal-blocking agent are not also specifically defined, provided that they are reactive with carboxyl groups. For example, they include aliphatic monoamines such as methylamine, ethylamine, propylamine, butylamine, hexylamine, octylamine, decylamine, stearylamine, dimethylamine, diethylamine, dipropylamine, dibutylamine, etc.; alicyclic monoamines such as cyclohexylamine, dicyclohexylamine, etc.; aromatic monoamines such as aniline, toluidine, diphenylamine, naphthylamine, etc.; and mixtures of any of them. Of those, preferred are butylamine, hexylamine, octylamine, decylamine, stearylamine, cyclohexylamine and aniline, in view of their reactivity and costs and of the stability of the blocked terminals.

The aromatic ring-containing bromine compound (B) that serves as a flame retardant in the invention includes, for example, aromatic ring-containing brominated polymers such as brominated polystyrenes, brominated polyphenylene ethers, brominated phenoxy resins, etc.; aromatic ring-containing low-molecular bromine compounds such as ethylene-bis-[tetrabromophthalimide], etc. Of those, preferably used is at least one selected from the group consisting of brominated polystyrenes, brominated polyphenylene ethers and brominated phenoxy resins. More preferred are brominated polystyrenes as giving polyamide compositions having higher heat resistance.

The brominated polystyrenes include, for example, polymonobromostyrenes, polydibromostyrenes, polytribromostyrenes, polytetrabromostyrenes, polypentabromostyrenes, etc. One or more of these can be used in the invention. The brominated polystyrenes can be produced, for example, by polymerizing one or more bromostyrene monomers such as monobromostyrene, dibromostyrene, tribromostyrene, tetrabromostyrene, pentabromostyrene and others, or by brominating polystyrenes.

The brominated polyphenylene ethers are, for example, those to be obtained by brominating polyphenylene ethers, as well as those to be obtained from a starting material of monobromophenol, dibromophenol, tribromophenol, tetrabromophenol, pentabromophenol or their mixtures by polymerizing them to a high degree. One or more of these brominated polyphenylene ethers can be used in the invention.

The brominated phenoxy resins are, for example, those to be obtained by polymerizing monobromobisphenol A, dibromobisphenol A, tribromobisphenol A, tetrabromobisphenol A, pentabromobisphenol A, hexabromobisphenol A, heptabromobisphenol A, octabromobisphenol A or their mixtures with epichlorohydrin; as well as those to be obtained by polymerizing bisphenol A with epichlorohydrin to give a phenoxy resin followed by brominating the resulting phenoxy resin. One or more of these brominated phenoxy resins can be used in the invention.

Preferably, the molecular weight of the aromatic ring-containing bromine compound (B) is at most 2,000,000, but more preferably falls between 1,000 and 1,000,000. These ranges include all specific values and subranges therebetween, such as 2,000, 5,000, 10,000, 50,000, 100,000, 250,000, 500,000, 750,000, 1,250,000, 1,500,000 and 1,750,000. The preferred aromatic ring-containing bromine compounds of which the molecular weight falls within the defined range as above give preferred polyamide compositions having better moldability and better mechanical properties. For aromatic ring-containing brominated polymers for the aromatic ring-containing bromine compound (B) to be used herein, the molecular weight is meant to indicate the weight-average molecular weight of the polymers. Preferably, the bromine content of the aromatic ring-containing bromine compound (B) is at least 40% by weight, more preferably at least 50% by weight. The preferred aromatic ring-containing bromine compound (B) of which the bromine content falls within the defined range as above gives preferred polyamide compositions having better flame retardancy.

In the polyamide composition of the invention, the amount of the aromatic ring-containing bromine compound (B) falls between 10 and 200 parts by weight, but preferably between 20 and 150 parts by weight, relative to 100 parts by weight of the polyamide (A). These ranges include all specific values and subranges therebetween, such as 15, 25, 50, 75, 100, 125 and 175 parts by weight, relative to 100 parts by weight of the polyamide (A). The polyamide composition in which the amount of the aromatic ring-containing bromine compound (B) falls within the defined range as above has good flame retardancy, good moldability and good mechanical properties.

As the flame-retardant synergist (C), herein used is at least one selected from metal salts of stannic acid and alkaline earth metal salts of boric acid. The metal salts of stannic acid include, for example, zinc stannate, zinc hydroxystannate, magnesium stannate, cobalt stannate, sodium stannate, potassium stannate, etc. The alkaline earth metal salts of boric acid include, for example, calcium borate, magnesium borate, etc. Of those, preferred is zinc stannate as having high flame retardation-promoting ability.

The compounds with crystal water may be used directly as they are, but are preferably baked at around a temperature not lower than 400° C. to remove crystal water therefrom before they are used to prepare the polyamide composition. This is because crystal water, if remaining in the compound, will vaporize while the polyamide composition comprising the compound is molded in melt, and the polyamide will be thereby hydrolyzed. The baked compounds with no crystal water are preferred, as being free from this problem. The compounds are generally in the form of solid powder. Preferably, the powdery solid compounds have a mean grain size of at most 100 $\mu$m, more preferably at most 30 $\mu$m, even more preferably at most 10 $\mu$m, for obtaining preferred moldings having better appearances. In order to improve their dispersibility in polyamides, the compounds serving as the flame-retardant synergist herein may be subjected to surface treatment with any of silane couplers, titanium couplers or the like.

The polyamide composition of the invention may optionally contain a filler (D) which may be in any form of fibers, powders, cloths, etc.

The fibrous filler includes, for example, organic fibrous fillers such as full-aromatic polyamide fibers, full-aromatic liquid-crystal polyester fibers and the like, for example, polyparaphenylene-terephthalamide fibers, polymetaphenylene-terephthalamide fibers, polyparaphenylene-isophthalamide fibers, polymetaphenylene-isophthalamide fibers, fibers obtained from condensates of diaminodiphenyl ether and terephthalic or isophthalic acid, etc.; and inorganic fibrous fillers such as glass fibers, carbon fibers, boron fibers, etc. Adding such a fibrous filler to the polyamide composition of the invention is desirable, since the mechanical strength of the moldings of the composition is enhanced and, in addition the dimension stability and the water-absorption resistance thereof are also enhanced. Preferably, the mean length of the fibrous filler falls between 0.05 and 50 mm. More preferably, it falls between 1 and 10 mm, as the moldability of the polyamide composition containing the filler is much improved and, in addition, the sliding properties, the heat resistance and the mechanical properties of the moldings of the composition are also improved. The fibrous filler may be fabricated into cloths, etc.

The powdery filler includes, for example, silica-alumina, alumina, titanium oxide, zinc oxide, boron nitride, talc, mica, potassium titanate, calcium silicate, magnesium sulfate, aluminum borate, asbestos, glass beads, carbon black, graphite, molybdenum disulfide, polytetrafluoroethylene, etc. Preferably, the powdery filler has a mean grain size of from 0.1 to 200 $\mu$m, more preferably from 1 to 100 $\mu$m. The powdery filler improves the dimension stability, the mechanical properties, the heat resistance, the chemical properties, the physical properties, the sliding properties and other properties of the moldings of the polyamide composition containing it.

As the filler (D), one or more of the substances noted above may be used either singly or as combined. Preferably, the amount of the filler (D) that may be in the polyamide composition of the invention falls between 0.1 and 200 parts by weight, more preferably between 0.1 and 150 parts by weight, even more preferably between 0.5 and 100 parts by weight, relative to 100 parts by weight of the polyamide (A) in the composition. These ranges include all specific values and subranges therebetween, such as 1, 5, 10, 25, 50, 75, 100, 125, 150 and 175 parts by weight, relative to 100 parts by weight of the polyamide (A) in the composition. The polyamide composition containing the filler within the defined range as above has better moldability and better mechanical properties. In order to improve its dispersibility in polyamides, the filler is preferably subjected to surface treatment with any of silane coupling agents, titanium coupling agents, or other high-molecular or low-molecular surface-treating agents.

The polyamide composition may optionally contain acid catchers such as hydrotalcite, etc.; other different types of polymers such as polyphenylene sulfides, polyolefins, polyesters, polyphenylene oxides, liquid-crystal polymers, etc.; colorants; UV absorbents; light stabilizers; antioxidants such as hindered phenols, thio compounds, phosphorus-containing compounds, amines, etc. antistatic agents; nucleating agents; plasticizers; mold release agents; lubricants, etc.

The polyamide composition of the invention can be produced by mixing the polyamide (A), the aromatic ring-containing bromine compound (B), the flame-retardant synergist (C), and optionally the filler (D) and other components such as those mentioned above, in any desired manner. For example, using a vertical or horizontal mixer generally employed for mixing resins, the polyamide (A), the aromatic ring-containing bromine compound (B), the flame-retardant synergist (C), and optionally the filler (D) and other components such as those mentioned above are mixed in a predetermined ratio, and the resulting mixture is kneaded in melt by the use of a single-screw extruder, a twin-screw extruder, a kneader, a Banbury mixer or the like to give the polyamide composition.

The polyamide composition of the invention may be molded into moldings of different shapes in any ordinary molding methods generally employed for molding ordinary thermoplastic resin compositions, for example, through injection molding, extrusion molding, press molding, blow molding, calender molding, cast molding or the like, for which any of the well-known molding devices may be used. For example, to obtain its molding of a predetermined shape, the polyamide composition is melted in the cylinder of an injection-molding machine which is so controlled that its cylinder temperature may fall between the melting point of the polyamide resin and 350° C., and then introduced (injected) into the mold of a predetermined shape in the machine. To obtain its fibrous molding, the polyamide composition is melted in an extruder which is so controlled that its cylinder temperature may fall within the defined range as above, and then spun out through the spinneret nozzle of the extruder to obtain its film or sheet molding, the polyamide composition is melted in an extruder which is so controlled that its cylinder temperature may fall within the defined range as above, and then extruded out through the T-die of the extruder. The moldings thus produced according to the methods noted above may be coated with paint, metal, or any other different types of polymers or the like to form a coating layer on their surfaces.

According to the invention, there is provided a polyamide composition having excellent flame retardancy and heat resistance, exhibiting good thermal stability and continuous moldability when molded in melt, and capable of being molded into good moldings having excellent appearances, especially fine color tone, without giving much gas, i.e., the mold used for melt-molding the composition is hardly corroded.

EXAMPLES

Having generally described this invention, a further understanding can be obtained by reference to certain specific examples which are provided herein for purposes of illustration only and are not intended to be limiting unless otherwise specified. In the Examples, the samples produced were tested for the heat resistance, the appearance of their moldings, the flame retardancy, the degree of mold corrosion, and the continuous moldability (the amount of drooled resin melt), according to the methods mentioned below.

Heat Resistance

Using a Mettler's TGA device, TG-10A, a sample to be tested was heated in a nitrogen stream at a heating rate of 10° C./min, and the temperature at which the loss in weight of the sample reached 5% was read. The temperature is an index of the heat resistance of the sample.

Appearance of Molding

Moldings having a size of 10 cm (length)×4 cm (width)×1 mm (thickness) were prepared through injection molding, and their appearances (color tone, surface condition) were macroscopically observed. The moldings not unfavorably colored and having a smooth and good surface condition were evaluated as "good"; and those unfavorably colored or having a rough and bad surface condition were evaluated as "bad".

Flame Retardancy

Flame retardancy was measured according to the UL-94 Standards in the manner mention ed below. A test piece of 1 mm thick having been prepared through injection molding was vertically fixed with its top end being clamped. Its bottom end was exposed to a predetermined flame for 10 seconds, and then separated from it. The time for which the test piece was still burning was read (first test). After the test piece was spontaneously extinguished, its bottom end was again exposed to the flame, and then separated from it, and the time for which the test piece was still burning was read (second test). Five test pieces of one sample were subjected to the flame test in that manner as above. Five data of the burning time in the first test and five data thereof in the second test, that is, 10 data of one sample were thus obtained. The total of those 10 data was represented by T; and the maximum value thereof was by M. Samples of which T was up to 50 seconds and M was up to 10 seconds, which did not burn to the clamped top end, and of which the burning melt of the test piece having dropped onto a cotton cloth (this was disposed at a position of 12 inches below the test piece) did not ignite the cotton cloth rank as the class "V-0"; samples of which T was up to 250 seconds and M was up to 30 seconds and which were the same as those of "V-0" for the other matters rank as the class "V-1"; and samples of which T was up to 250 seconds and M was up to 30 seconds, which did not burn to the clamped top end, but of which the burning melt of the test piece having dropped onto a cotton cloth (this was disposed at a position of 12 inches below the test piece) ignited the cotton cloth rank as the class "V-2".

Degree of Mold Corrosion 2 g of pellets (2 mm diameter×3 mm length) of a polyamide composition sample to be tested and a copper piece (10 mm×20 mm) were put into a test tube and sealed. This was heated in an oven at 150° C. for 24 hours, and the change in the surface appearance of the copper piece was macroscopically checked. The change is an index of the degree of mold corrosion to be produced by the gas from the sample.

Continuous Moldability (Amount of Drooled Resin Melt)

Moldings having a size of 10 cm (length)×4 cm (width)×1 mm (thickness) were prepared through continuous injection molding for 20 shots at a cylinder temperature of 330° C. In the process, the mean residence time of resin shots was about 2 minutes. Next, the nozzle was separated from the mold, and left as it was for 30 seconds. The amount (g) of the drooled resin melt (that is, the amount of the resin melt drooled from the tip of the nozzle of the molding machine) was measured, and this is an index of the continuous moldability of the resin sample tested.

Reference Example 1

3256.1 g (19.60 mols) of terephthalic acid, 2960.9 g (17.0 mols) of 1,9-nonanediamine, 474.9 g (3.0 mols) of 2-methyl-1,8-octanediamine, 97.7 g (0.80 mols) of benzoic acid, 6.8 g (0.1% by weight of the starting compounds) of sodium hypophosphite monohydrate and 2.2 liters of distilled water were put into a 20-liter autoclave, and purged with nitrogen. These were stirred at 100° C. for 30 minutes, and the inner temperature was elevated up to 210° C. over a period of 2 hours. In this step, the pressure in the autoclave was elevated up to 22 kg/cm$^2$. In that condition, the reaction was continued for 1 hour, and then the temperature was elevated up to 230° C. The reaction was further continued for 2 hours at the elevated temperature of 230° C. under the increased pressure of 22 kg/cm$^2$, while the water vapor was gradually removed from the system. Next, the pressure was lowered to 10 kg/cm$^2$ over a period of, 30 minutes, and the reaction was still further continued under the condition. Thus was obtained a prepolymer having a limiting viscosity [η], as measured in concentrated sulfuric acid at 30° C., of 0.21 dl/g. This was dried at 100° C. under reduced pressure for 12 hours, and ground into grains of 2 mm in size. This was polymerized in a solid phase at 230° C. under 0.1 mmHg for 10 hours. The polymer thus obtained is a white polyamide having a melting point of 308° C., a limiting viscosity [η], as measured in concentrated sulfuric acid at 30° C. of 1.04 dl/g, and a percentage of terminal blocking of 90%.

Reference Examples 2 and 3

Polyamides were produced in the same manner as in Reference Example 1, except that the dicarboxylic acid component, the diamine component and the terminal-blocking agent (benzoic acid) shown in Table 1 below were used in the ratio indicated therein. The limiting viscosity [η] as measured in concentrated sulfuric acid at 30° C., and the percentage of terminal blocking of the polyamides produced are given in Table 1.

screw rotation speed was 40 rpm. The melt strands were cooled in a cooling water tank, and pelletized into pellets of a polyamide composition. The pellets were dried in vacuum at 120° C. for 12 hours, and molded through injection molding for which was used an injection-molding machine, Nissei Resin Industry's NS15. The cylinder temperature was 320° C. and the mold temperature was 150° C. The resulting moldings were tested and evaluated according to the methods mentioned above. The data are given in Table 2 below.

TABLE 1

| | Starting Compounds for Polyamide | | | | | | Polyamide | |
|---|---|---|---|---|---|---|---|---|
| | Dicarboxylic Acid Component | | Diamine Component | | Terminal-Blocking Agent | | Limiting Viscosity [η] | Percentage Terminal |
| | Compound | Amount (mol) | Compound | Amount (mol) | Compound | Amount (mol) | (dl/g) | Blocking (%) |
| Ref. Ex. 1 | TA | 19.60 | NMDA/MODA | 17.0/3.0 | BA | 0.80 | 1.04 | 90 |
| Ref. Ex. 2 | TA | 19.60 | NMDA/MODA | 17.0/3.0 | BA | 0.60 | 1.30 | 92 |
| Ref. Ex. 3 | TA/IA | 14.0/6.0 | HMDA | 20.0 | BA | 0.20 | 1.01 | 43 |

Details of Abbreviations:
TA: terephthalic acid
IA: isophthalic acid
NMDA: 1,9-nonanediamine
MODA: 2-methyl-1,8-octanediamine
HMDA: 1,6-hexanediamine
BA: benzoic acid

Example 1

100 parts by weight of the polyamide of Reference Example 1 was blended in dry with 45 parts by weight of brominated polystyrene (Manac's Plasafety 1200Z), 7 parts by weight of zinc stannate (Nippon Light Metal's Flamtard-S) and 75 parts by weight of glass fibers (Nitto Boseki's CS 3J-256). The resulting blend was extruded in melt through a twin-screw extruder, Toyo Seiki's Laboplastomil 2D25W, for which the cylinder temperature was 320° C. and the

Examples 2 to 11

Polyamide compositions were produced in the same manner as in Example 1, except that the polyamide, the flame retardant, the flame-retardant synergist and the glass fibers shown in Table 2 were used in the ratio indicated therein. These were separately molded into moldings also in the same manner as in Example 1, and the moldings were tested and evaluated according to the methods mentioned above. The data are given in Table 2.

TABLE 2

| | Ex. 1 | Ex. 2 | Ex. 3 | Ex. 4 | Ex. 5 | Ex. 6 | Ex. 7 | Ex. 8 | Ex. 9 | Ex. 10 | Ex. 11 |
|---|---|---|---|---|---|---|---|---|---|---|---|
| Polyamide | Ref. Ex. 1 | Ref. Ex. 2 | Ref. Ex. 3 | Ref. Ex. 1 | Ref. Ex. 2 | Ref. Ex. 1 | Ref. Ex. 2 | Ref. Ex. 1 | Ref. Ex. 1 | Ref. Ex. 1 | Ref. Ex. 3 |
| Flame Retardant (amount)[1] | A (45) | B (45) | A (45) | C (75) | C (75) | D (52) | D (52) | A (45) | E (45) | F (75) | C (75) |
| Flame-retardant synergist (amount)[1] | a (7) | b (7) | a (7) | a (10) | a (10) | a (7) | a (7) | c (10) | a (7) | a (10) | a (10) |
| Glass Fibers (amount)[1] | (75) | (75) | (75) | (90) | (90) | (80) | (80) | (75) | (75) | (90) | (90) |
| Heat Resistance (° C.) | 440 | 439 | 430 | 435 | 434 | 437 | 437 | 418 | 439 | 420 | 426 |
| Appearance of Moldings | good | good | good | good | good | good | good | good | good | good | good |
| Amount of Drooled Resin Melt (g) | 0.08 | 0.17 | 0.12 | 0.05 | 0.01 | 0.05 | 0.01 | 0.11 | 0.25 | 0.30 | 0.10 |
| Flame Retardancy | V-0 | V-0 | V-0 | V-0 | V-0 | V-0 | V-0 | V-0 | V-0 | V-0 | V-0 |
| Mold Corrosion | no change | no change | no change | no change | no change | no change | no change | no change | no change | no change | no change |

[1]Amount (parts by weight) relative to 100 parts by weight of polyamide
Flame Retardants:
A: brominated polystyrene (Manac's Plasafety 1200Z)
B: brominated polystyrene (Ferro Japan's Pyrocheck 68PB)
C: brominated polystyrene (Greatlakes' PDBS-80)
D: brominated polystyrene (Greatlakes' PBS-64)
E: brominated polyphenylene ether (Dai-ichi Kogyo Seiyaku's SR-460B)
F: brominated phenoxy resin (Toto Chemical's YPB-43C)

TABLE 2-continued

|  | Ex. 1 | Ex. 2 | Ex. 3 | Ex. 4 | Ex. 5 | Ex. 6 | Ex. 7 | Ex. 8 | Ex. 9 | Ex. 10 | Ex. 11 |
|---|---|---|---|---|---|---|---|---|---|---|---|

Flame-retardant synergists:
a: zinc stannate (Nippon Light Metal's Flamtard-S)
b: zinc hydroxystannate (Nippon Light Metal's Flamtard-H)
c: calcium borate (Kamishima Chemical's UB Powder)
Glass Fibers: Nitto Boseki's CS 3J-256

Comparative Examples 1 and 2

Polyamide compositions were produced in the same manner as in Example 1, except that the polyamide, the flame retardant, the flame-retardant synergist and the glass fibers shown in Table 3 below were used in the ratio indicated therein. These were separately molded into moldings also in the same manner as in Example 1, and the moldings were tested and evaluated according to the methods mentioned above. The data are given in Table 3.

Comparative Examples 4 to 9

Polyamide compositions were produced in the same manner as in Example 1, except that the polyamide, the flame retardant and the glass fibers shown in Table 3 were used in the ratio indicated therein. These were separately molded into moldings also in the same manner as in Example 1, and the moldings were tested and evaluated according to the methods mentioned above. The data are given in Table 3.

TABLE 3

|  | Comp. Ex. 1 | Comp. Ex. 2 | Comp. Ex. 3 | Comp. Ex. 4 | Comp. Ex. 5 | Comp. Ex. 6 | Comp. Ex. 7 | Comp. Ex. 8 | Comp. Ex. 9 |
|---|---|---|---|---|---|---|---|---|---|
| Polyamide | Ref. Ex. 1 | Ref. Ex. 3 | Ref. Ex. 1 | Ref. Ex. 1 | Ref. Ex. 1 | Ref. Ex. 3 | Ref. Ex. 1 | Ref. Ex. 1 | Ref. Ex. 1 |
| Flame Retardant | A | A | A | B | — | C | A | A | A |
| (amount)[1] | (45) | (45) | (45) | (45) |  | (85) | (45) | (45) | (45) |
| Flame-retardant | d | d | e | — | a | d | f | g | f + g |
| synergist (amount)[1] | (7) | (7) | (7) |  | (50) | (7) | (7) | (7) | (3.5 ± 3.5) |
| Glass Fibers | (75) | (75) | (75) | (80) | (75) | (95) | (75) | (75) | (75) |
| (amount)[1] |  |  |  |  |  |  |  |  |  |
| Heat Resistance | 379 | 370 | —[2] | 392 | 440 | 362 | 420 | 407 | 415 |
| (° C.) |  |  |  |  |  |  |  |  |  |
| Appearance of | bad | bad | —[2] | bad | good | bad | good | bad | bad |
| Moldings | (blackened) | (blackened) |  | (blackened) |  | (blackened) |  | (browned) | (dark browned) |
| Amount of Drooled | 2.1 | 3.5 | —[2] | 2.5 | 0.01 | 2.7 | 2.1 | 0.6 | 1.9 |
| Resin Melt (g) |  |  |  |  |  |  |  |  |  |
| Flame Retardancy | V-0 | V-0 | —[2] | V-2 | V-2 | V-0 | V-0 | V-0 | V-0 |
| Mold Corrosion | changed to reddish brown | changed to reddish brown | —[2] | changed to brown | no change | changed to brown | no change | changed to brown | no change |

[1] Amount (parts by weight) relative to 100 parts by weight of polyamide
[2] As the polyamide composition could not be pelletized, evaluating it was impossible.
Flame Retardants:
A: brominated polystyrene (Manac's Plasafety 1200Z)
B: brominated polystyrene (Ferro Japan's Pyrocheck 68PB)
C: brominated polystyrene (Greatlakes' PDBS-80)
Flame-retardant synergists:
a: zinc stannate (Nippon Light Metal's Flamtard-S)
b: sodium antimonate (Nissan Chemical's NA-1070L)
e: antimony trioxide (Nippon Seiko's Patox-M)
f: zinc oxide
g: tin oxide
Glass Fibers: Nitto Boseki's CS 3J-256

Comparative Example 3

Producing a polyamide composition was tried in the same manner as in Example 1, except that the polyamide, the flame retardant, the flame-retardant synergist and the glass fibers shown in Table 3 were used in the ratio indicated therein. However, while the components were kneaded in melt, much gas was formed whereby the resin was blackened and the melt viscosity of the blend decreased. As a result, the polyamide composition could not be pelletized. In this, therefore, moldings could not be obtained, and evaluating them was impossible.

Obviously, numerous modifications and variations of the present invention are possible in light of the above teachings. It is therefore to be understood that within the scope of the appended claims, the invention may be practiced otherwise than as specifically described herein.

This application is based on Japanese Patent Application Serial No. 21413/1999, filed on Jan. 29, 1999, and incorporated herein by reference in its entirety.

What is claimed is:

1. A polyamide composition, comprising:
   (A) 100 parts by weight of a polyamide,
   (B) from 10 to 200 parts by weight of an aromatic ring-containing bromine compound, and (C) from 0.1 to 200 parts by weight of at least one flame-retardant synergist selected from the group consisting of metal salts of stannic acid and alkaline earth metal salts of boric acid, wherein the polyamide (A) comprises (a) dicarboxylic acid units of which from 60 to 100 mol % are terephthalic acid units and (b) diamine units of which from 60 to 100 mol % are $C_{6-18}$ aliphatic alkylenediamine units, and wherein the aliphatic alkylenediamine units are 1,9-nonanediamine units and/or 2-methyl-1,8-octanediamine units.

2. The polyamide composition of claim 1, which further comprises (D) from 0.1 to 200 parts by weight, relative to 100 parts by weight of the polyamide (A), of a filler.

3. The polyamide composition of claim 1, wherein (B) comprises at least one member selected from the group consisting of aromatic ring-containing brominated polymers and aromatic ring-containing low-molecular bromine compounds.

4. The polyamide composition of claim 1, wherein (B) comprises at least one member selected from the group consisting of brominated polystyrenes, brominated polyphenylene ethers, brominated phenoxy resins and ethylene-bis-[tetrabromophthalimide].

5. The polyamide composition of claim 1, wherein (C) comprises at least one member selected from the group consisting of zinc stannate, zinc hydroxystannate, magnesium stannate, cobalt stannate, sodium stannate, potassium stannate, calcium borate, and magnesium borate.

6. A molding of the polyamide composition of claim 1.

7. A method of making a polyamide mold, comprising molding the polyamide composition of claim 1.

8. A method of making the polyamide of claim 1, comprising combining (A), (B) and (C).

* * * * *